United States Patent [19]

Blaser et al.

[11] Patent Number: 4,496,852

[45] Date of Patent: Jan. 29, 1985

[54] LOW POWER CLOCK GENERATOR

[75] Inventors: Eugene M. Blaser, Hopewell Junction; Paul W. Chung, Wappingers Falls, both of N.Y.; Ramesh C. Varshney, San Jose, Calif.

[73] Assignee: International Business Machines Corporation, Armonk, N.Y.

[21] Appl. No.: 441,707

[22] Filed: Nov. 15, 1982

[51] Int. Cl.³ .................. H03K 17/06; H03K 5/135; H03K 17/10; H03K 19/096

[52] U.S. Cl. .................. 307/269; 307/481; 307/482; 307/578

[58] Field of Search ............. 307/443, 444, 453, 450, 307/481, 482, 575, 578, 583, 269, 270, 594, 601, 602, 607, 296 A

[56] References Cited

U.S. PATENT DOCUMENTS

| | | | |
|---|---|---|---|
| 3,774,055 | 11/1973 | Bapat | 307/279 |
| 3,872,321 | 3/1975 | Matsue | 307/482 X |
| 4,010,453 | 3/1977 | Lewis | 307/279 |
| 4,021,682 | 5/1977 | Elmer et al. | 307/362 |
| 4,090,096 | 5/1978 | Nagami | 307/269 |
| 4,165,541 | 8/1979 | Varshney et al. | 365/219 |
| 4,219,743 | 8/1980 | Milln et al. | 307/270 X |
| 4,276,487 | 6/1981 | Arzubi et al. | 307/270 X |
| 4,449,066 | 5/1984 | Aoyama et al. | 307/482 X |

*Primary Examiner*—Stanley D. Miller
*Assistant Examiner*—David R. Bertelson

*Attorney, Agent, or Firm*—Sughrue, Mion, Zinn, Macpeak & Seas

[57] ABSTRACT

A clock generator circuit for producing with very little power dissipation an output clock signal having levels determined by positive and negative power supply levels from an input clock signal having levels determined by the positive power supply level and ground. In a low state of the input clock signal, an upper or first transistor of an output transistor pair connected in series between positive and negative power supply levels is turned off by applying a ground level to the base thereof, while the lower or second transistor of the output transistor pair is turned off by applying a positive potential to its base. When the input clock signal makes a transition from the low state to the high state, a bootstrap capacitor is charged between the positive and negative power supply levels to provide a boosted positive voltage to turn on the upper transistor. While the bootstrap capacitor is charging, the base of the lower transistor is lightly grounded to partially turn it on. When the charge on the bootstrap capacitor has reached a predetermined level, the base of the first transistor is taken to the negative power supply level through an inverting transistor, the base of which also receives the boosted voltage developed across the bootstrap capacitor. By using a fully dynamic circuit arrangement, only a very small amount of power is required for operating the circuit.

10 Claims, 2 Drawing Figures

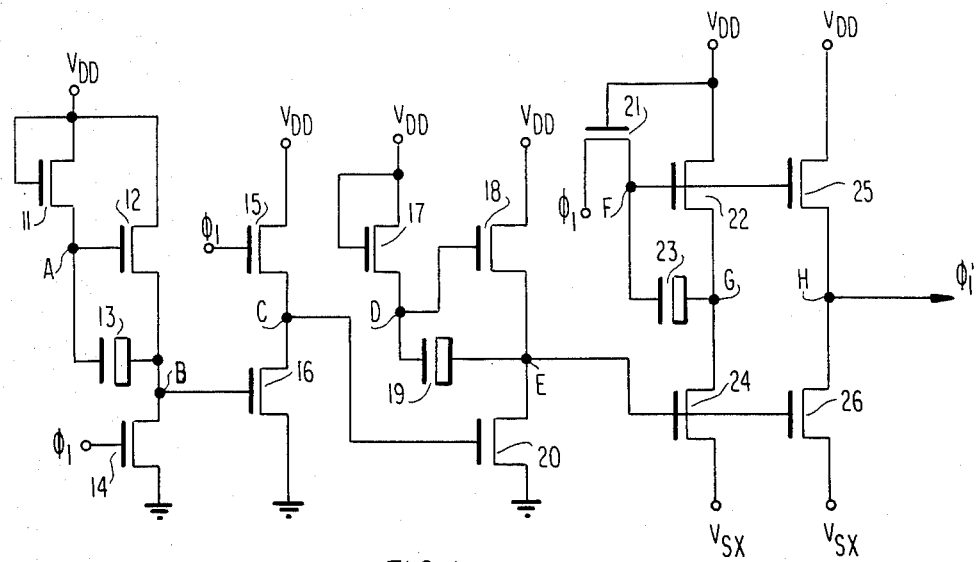
FIG. 1 (PRIOR ART)
FIG. 2
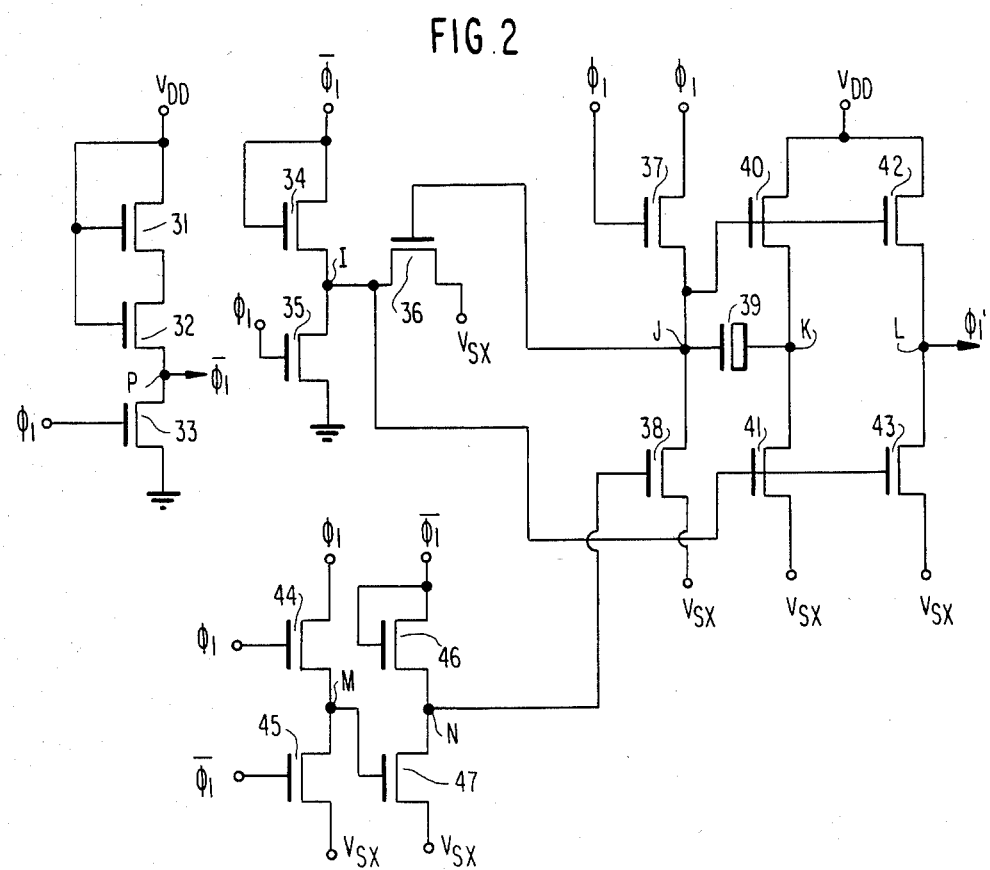

4,496,852

LOW POWER CLOCK GENERATOR

BACKGROUND OF THE INVENTION

The invention pertains to the clock signal generator circuit implemented with FET devices. More particularly, the invention pertains to such a clock generating circuit in which an output clock signal having high (1) and low (0) levels corresponding to positive and negative power supply levels is produced from an input clock signal having high and low levels corresponding to the positive power supply level and the ground level. The circuit of the invention finds application as a clock signal generator for devices such as an CCD (Charge Coupled Device), particularly, as a circuit for generating a clock signal used for clocking a data signal from the last bit position of the CCD to a utilization circuit.

A prior art clock generator circuit of the same general type to which the invention pertains is shown in FIG. 1. In this circuit, the input clock signal $\phi_1$ is applied to an input inverter circuit composed of FET devices 11–14. The channels of the devices 12 and 14 are connected in series between a power supply terminal to which a positive potential $V_{DD}$ is applied and ground. The source and the drain of the device 13 are interconnected to form a capacitor in a well known manner. The capacitor (device) 13 is connected as a bootstrap capacitor between node A (the gate of the device 12) and node B (the source of the device 12). The input clock signal drives the gate of the device 14.

The inverted input signal from the input circuit from the drain of the device 14 at node B is applied to the gate of a device 16, the channel of which is connected in series with that of a device 15 between $V_{DD}$ and ground. The input signal $\phi_1$ is also applied to the gate of the device 15. Thus, the devices 15 and 16 form a second inverting stage with an uninverted but delayed version of the input signal being developed at a node C. A third circuit composed of devices 17–20, identical in arrangement to the circuit of the devices 11–14, reinverts the signal developed at the node C. Thus, an inverted version of the input signal $\phi_1$ is developed at a node E with a delay between the signal developed at the node E and the input clock signal $\phi_1$ of a duration determined by parameters of the devices 11–20.

An output section is composed of devices 21–24 in a driver stage and devices 25 and 26 in an output stage. The sources of the devices 24 and 26 are connected to the substrate potential $V_{SX}$ (which is a negative voltage), while the drains of the devices 22 and 25 are connected to the positive power supply potential $V_{DD}$. As an example, it is assumed that $V_{DD}=8.5$ V and $V_{SX}=-2.2$ V. The device 23 is connected as a bootstrap capacitor between a node G at the interconnection point between the drain of the device 24 and the source of the device 22 and a node F at the gates of the devices 22 and 25 and the source of the device 21. The transistor 21 has a gate connected to the power supply potential $V_{DD}$, and the input signal $\phi_1$ is applied to the source.

Operationally, when $\phi_1=0$ (ground level), the node E is at the positive power supply potential $V_{DD}$, and hence the devices 24 and 26 are turned on while the devices 22 and 25 are turned off. The output signal $\phi_1'$ is thus driven to near the substrate potential $V_{SX}$. At this time, the node G is of course also at a potential near the substrate potential $V_{SX}$ and the node F near ground potential. When $\phi_1$ changes from the 0 to the 1 state, a potential near $V_{DD}$ is applied to the node F almost immediately through the device 21. Because the node G is then still near $V_{SX}$, the bootstrap capacitor 13 is thus rapidly charged through the device 24. After the predetermined delay time, the voltage at node E goes to ground. Accordingly, the devices 24 and 26 are shut off (partially) to thereby release the nodes G and H. The potential developed across the capacitor 23 is then applied as a bootstrap drive signal to the gates of the devices 22 and 25, thereby driving the output signal $\phi_1$ to the positive power supply potential $V_{DD}$.

Although this circuit is in fact capable of producing the desired output waveform, nevertheless, it is disadvantageous for two reasons.

First, the power dissipation of the circuit is quite high. The reason for this is that when $\phi_1=1$, all of the devices 11, 12, 14, 17, 18 and 20 are turned on, while when $\phi_1=0$, the devices 15 and 16 are turned on. This provides current paths directly through those devices between $V_{DD}$ and ground. Also, there is some power loss in the devices 22–26 since when $\phi_1=1$, the gates of the devices 24 and 26 are at ground while the sources are at $V_{SX}$ (below ground), and hence the devices 24 and 26 are partially turned on. Current can thus flow from $V_{DD}$ to ground through the devices.

Secondly, in order to keep the devices 24 and 26 turned on when $\phi_1=1$ and the potential of the node E is near ground, because the sources of the devices are below ground, it is necessary to increase the threshold voltages of the devices 24 and 26. To do this, it has been the practice to utilize a second polysilicon layer in the fabrication of the gate structures of the devices that includes a barrier implant. The use of such a layer, however, is disadvantageous in that fabrication of the circuit becomes more difficult. Moreover, if the amount of the barrier implant is not within precisely determined limits, the circuit may be inoperative.

SUMMARY OF THE INVENTION

Accordingly, it is an object of the present invention to provide a clock driver circuit capable of generating an output clock pulse signal having levels varying between a negative power supply potential and a positive power supply potential from an input clock signal having levels varying between a positive power supply potential and ground in which the power dissipation of the circuit is remarkably reduced with respect to prior art configurations.

It is a further object of the invention to provide such a clock driver circuit which requires the use of only a single polysilicon layer in the fabrication of the gate structures of all the devices which make up the circuit and in which no barrier implant is needed.

These, as well as other objects of the invention, are met by a clock signal generator circuit in which driver and inverter circuits utilize a dynamic configuration, that is, a configuration in which there is no direct current path between power supply potential levels in either state of the input clock signal. Further, in the circuit of the invention, a bootstrap-capacitor-developed drive voltage is used to drive an inverter transistor having a channel connected between the negative power supply potential and the gates of lower devices (the devices having sources connected to the negative substrate potential) of driver and output stages. This circuit arrangement makes it possible to apply a negative drive potential to the gates of the lower devices of the driver and output stages to thereby completely turn off those two devices when the input clock signal is in the high state without having to use a barrier-implant-containing polysilicon layer in their gate structures.

More specifically, the clock signal circuit of the present invention includes a first inverter circuit for producing an inverted version of the input clock signal. A two-stage level-shifter circuit is provided including two stages, each of which includes two series-connected devices, with the first stage of the level-shifter circuit being connected to drive the second stage. The sources of the lower two transistors of the two stages of the level-shifter circuit are connected to the negative power supply potential, while the drains of upper transistors of the first and second stages receive the uninverted and inverted clock signals, respectively. The uninverted and inverted clock signals drive the gates of the upper and lower devices, respectively, in the first stage of the level-shifter circuit. The output of the level-shifter circuit is applied to the gate of an intermediate driver stage composed of two series-connected devices. In this intermediate drive stage, the source of a lower transistor is connected to the negative power supply potential, and the drain and gate of an upper transistor are connected to the input signal. A final driver stage and an output stage are provided having the same configuration as the driver and output stages in the prior art circuit. However, in the circuit of the invention, the connection node at the gates of the upper transistors of the driver and output stages and the bootstrap capacitor 13 connected to the common connection point between the devices of the intermediate drive stage. This node is also connected to the gate of an inverter transistor, the source of which is connected to the negative power supply potential and the drain to the gates of the lower transistors of the drive and output stages. To the latter point is also connected the output of another inverter circuit used for turning on the lower devices of the final driver and output stages during the time the bootstrap capacitor is being charged. This latter inverter circuit is constructed similar to the two stages of the level-shifter circuit with an upper transistor having both its gate and drain connected to the inverted input signal to provide a dynamic circuit arrangement in which no current path is formed through the devices between power supply levels.

BRIEF DESCRIPTION OF THE DRAWINGS

FIG. 1 is a schematic diagram of a prior art clock generator circuit of the same general type to which the invention pertains; and FIG. 2 is a schematic diagram of a preferred embodiment of a clock generator circuit of the invention.

DESCRIPTION OF THE PREFERRED EMBODIMENTS

Referring now to FIG. 2, a circuit diagram of a preferred embodiment of a clock generator circuit of the invention will be described.

An input inverter circuit is composed of devices 31–33 having channels connected in series with one another between a positive power supply level $V_{DD}$ and ground. The gates of the devices 31 and 32 are connected to $V_{DD}$, and the input clock is applied to the gate of the device 33. The inverted clock signal $\overline{\phi_1}$, is developed at a node P between the channels of the devices 32 and 33. Because little drive power is required from them, the devices 31–33 can be small.

A two-stage dynamic level-shifter circuit is constructed of devices 44–47. The first stage includes devices 44 and 45 having channels connected in series between the negative substrate potential $V_{SX}$ and the input clock signal $\phi_1$. The input clock signal $\phi_1$ is applied to the gate of the device 44 while the inverted clock signal $\overline{\phi_1}$ is applied to the gate of the device 45. The output signal from the first stage of the level-shifter circuit at a node M between the devices 44 and 45 is coupled to the gate of the lower device 47 of the second stage. The devices 46 and 47 of the second stage of the level-shifter circuit are connected in series with one another between the negative substrate level $V_{SX}$ and the inverted clock signal $\overline{\phi_1}$. $\overline{\phi_1}$ is also applied to the gate of the device 46. The output from the two-stage level-shifter circuit is developed at a node N between the devices 46 and 47. This signal follows $\phi_1$ but has levels determined by the levels of the high state potential of $\phi_1$ and $V_{SX}$.

The arrangements of a final driver circuit (devices 40 and 41) and an output circuit (devices 42 and 43) are similar to those of the driver and output stages in the above-described prior art arrangement. However, unlike the prior art arrangement, the node J at the gate of the upper device 40 of the final driver stage and the bootstrap capacitor 39 is driven by an intermediate driver stage composed of devices 37 and 38 having channels connected in series with one another. The gate of the device 38 is connected to the node N of the two-stage level-shifter circuit. The input clock signal $\phi_1$ is applied to both the gate and drain of the device 37. The node J is also connected to the gate of an inverter transistor 36 having its source connected to the negative power supply potential $V_{SX}$ and drain connected at a node I to the gates of the lower devices 41 and 43 of the final driver and output stages, respectively. Also connected to the node I is the output of an inverter circuit composed of devices 34 and 35. The purpose of this inverter circuit is to turn on the device 41 for changing the bootstrap capacitor (device) 39. The source of the device 34 is connected to the node P to receive the inverted clock signal $\overline{\phi_1}$, while the clock signal $\phi_1$ is applied to the gate of the device 35. For reasons which will be described below, the device 36 should be made larger than the device 35.

Operationally, when $\phi_1$ goes to the 1 state after quiescence has been reached in the 0 state, the node M is taken to a positive level to thereby discharge the node N to the $V_{SX}$ level. The device 38 is then turned off. The device 35 will take the node I to ground level to partially turn on the devices 41 and 43. Hence, the capacitor 39 is then charged between the potential of $\phi_1$ applied through the device 37 and the negative power supply level at $V_{SX}$.

As soon as the node I reaches $V_{SX}$ due to the turning on of the device 36 by the charging of the capacitor 39, the gates of the devices 41 and 43 will be taken to $V_{SX}$, thus fully turning off the devices 41 and 43 and hence releasing the nodes K and L. At that time, the node J is bootstrapped by the action of the capacitor 39 to drive the output $\phi_1'$ to the $V_{DD}$ level from the $V_{SX}$ level.

As mentioned above, the device 36 should be larger than the device 35. The reason for this is to loosely ground the node I through the device 35 to charge the capacitor 39 through device 51 and then pull the node I to the $V_{SX}$ level through the device 36 after the node J has reached the $V_{SX}$ level.

When $\phi_1$ goes to the low state and, consequently, $\overline{\phi_1}$ to the high state, the node M will be discharged to $V_{SX}$ to thereby shut off the device 47 and to cause the node N to go to $V_{DD}$ and hence turn on the device 38 discharge the node J to $V_{SX}$. Also at that time, the devices 40 and 42 will be turned off and the node I will rise to turn on the devices 41 and 43 and hence drive the output $\phi_1'$ to VSX.

The above-described circuit of the invention dissipates much less power than the prior art circuit shown in FIG. 1. The reasons for this are as follows. Because in each of the two-device stages composed of devices 32, 38; 34, 35; 44, 45; and 46, 47 the upper one of the transistor pairs has a gate and drain connected to one of $\phi_1$ or $\overline{\phi_1}$ while the lower transistor of the pairs is driven oppositely in phase, no current paths are established between power supply levels through series-connected transistor pairs as in the case of the prior art arrangement. The input inverter circuit composed of the devices 31–33 utilizes a current path between $V_{DD}$ and ground. However, because, as mentioned above, the drive requirements of the signal $\overline{\phi_1}$ are relatively small and all of the devices 31–33 can be quite small, little power is consumed.

By way of comparison, a circuit of the invention was constructed in accordance with the circuit of FIG. 2 and compared with a circuit of the FIG. 1 arrangement. It was found that the circuit of the invention typically dissipated a power of only about 9 mW, while the prior art arrangement required typically 60 mW.

Moreover, the circuit of the invention is advantageous in that only a single polysilicon layer is required for fabricating all of the gate structures of the various devices which make up the circuit. No second polysilicon layer having a barrier implant is required with the circuit of the invention. Hence, the circuit of the invention is easier to fabricate and more reliable than the previously used arrangement.

This completes the description of the preferred embodiments of the invention. While preferred embodiments have been described, it is believed that numerous alterations and modifications thereto would be apparent to one having ordinary skill in the art without departing from the spirit and scope of the invention.

We claim:

1. A clock generator circuit for producing an output clock signal having levels determined by positive and negative power supply levels in response to an input clock signal having levels determined by said positive power supply level and a ground level, comprising:
    an output transistor pair having conductive channels coupled in series between said positive power supply level and said negative power supply level;
    a final drive transistor pair having channels coupled in series between said positive power supply level and said negative power supply level, gates of the transistors of said final drive transistor pair being coupled to gates of corresponding ones of the transistors of said output transistor pair;
    a bootstrap capacitor coupled between a first node at the commonly coupled gates of one transistor of said output transistor pair and the corresponding transistor of said drive transistor pair, and a second node between said channels of said output transistor pair;
    an inverter transistor having a channel coupled between said negative power supply level and a third node at the commonly coupled gates of the other transistor of said output transistor pair and the corresponding transistor of said drive transistor pair, and a gate coupled to said first node;
    means for grounding said second node in response to said input clock signal going to said positive power supply level from said ground level until said inverter transistor is switched into its conducting state in response to charging of said bootstrap capacitor; and
    means for discharging said first node to said negative power supply level in response to said input clock signal going from said positive power supply level to said ground level.

2. The clock generator circuit of claim 1, wherein all of said transistors are FET devices having a single common gate oxide layer.

3. The clock generator circuit of claim 2, wherein said means for grounding said second node comprises a third transistor pair having channels coupled in series between said positive power supply level and ground, a junction point between said transistors of said third pair being coupled to said third node and a gate of one transistor of said third pair receiving said input clock signal; and means for inverting said input clock signal, the inverted clock signal being applied to a gate and drain of the other transistor of said third pair.

4. The clock generator circuit of claim 3, wherein said means for discharging said first node comprises an eighth transistor having a channel coupled between said first node and said negative power supply level; and level-shifting circuit means operating in response to said input clock signal and said inverted clock signal for applying said negative power supply level to the gate of said eighth transistor in response to said input clock signal going to said ground level.

5. The clock generator circuit of claim 4, wherein said level-shifting circuit means comprises ninth through twelfth transistors, said ninth and tenth transistors having channels coupled in series between said input clock signal and said negative power supply level, said input clock signal being applied to a gate of said ninth transistor and said inverted clock signal being applied to a gate of said tenth transistor, said eleventh and twelfth transistors having channels coupled in series between said inverted clock signal and said negative power supply level, said inverted clock signal being applied to a gate of said eleventh transistor, a gate of said twelfth transistor being coupled to a junction point between the channels of said ninth and tenth transistors, and a junction point between the channels of said eleventh and twelfth transistors being coupled to said gate of said eighth transistor.

6. The clock generator circuit of claim 5, wherein said means for inverting said input clock signal comprises thirteenth and fourteenth transistors having channels coupled in series between said positive power supply level and ground, a gate of said thirteenth transistor being coupled to said positive power supply level, said input clock signal being applied to a gate of said fourteenth transistor, said inverted clock signal being produced at a junction point between the channels of said thirteenth and fourteenth transistors.

7. A clock generator circuit for producing an output clock signal having levels determined by positive and negative power supply levels in response to an input clock signal having levels determined by said postive power supply level and a ground level, comprising:
    a first FET having a drain and gate coupled to said positive power supply level;

a second FET having a drain connected to a source of said of first FET and a gate coupled to said positive power supply level;

a third FET having a source coupled to ground and a drain coupled to a source of said second FET, said input clock signal being applied to a gate of said third FET;

a fourth FET having a drain and gate coupled to said drain of said third FET;

a fifth FET having a drain coupled to a source of said fourth FET and a source coupled to ground, said input clock signal being applied to a gate of said fifth FET;

a sixth FET having a source coupled to said negative power supply level and a drain coupled to said source of said fourth FET and said drain of said fifth FET, a channel resistance of said sixth FET when turned on being less than a channel resistance of said fifth FET when turned on;

a seventh FET, said input clock signal being applied to a drain and gate of said seventh FET, a source of said seventh FET being coupled to a gate of said sixth FET;

an eighth FET having a drain coupled to said source of said seventh FET and a source coupled to said negative power supply level;

a ninth FET having a drain coupled to said positive power supply level and a gate coupled to said source of said seventh FET;

a capacitor coupled between a source of said ninth FET and said source of said seventh FET;

a tenth FET having a drain coupled to said source of said ninth FET, a gate coupled to said drain of said sixth FET, and a source coupled to said negative power supply level;

an eleventh FET having a drain coupled to said positive power supply level and a gate coupled to said gate of said ninth FET;

a twelfth FET having a drain coupled to a source of said eleventh FET, a gate coupled to said gate of said tenth FET, and a source coupled to said negative power supply level, said output clock signal being produced at said drain of said twelfth FET;

a thirteenth FET, said input clock signal being applied to a drain and gate of said thirteenth FET;

a fourteenth FET having a drain coupled to a source of said thirteenth FET, a gate coupled to said drain of said third FET, and a source coupled to said negative power supply level;

a fifteenth FET having a drain and gate coupled to said drain of said third FET; and a sixteenth FET having a drain coupled to a source of said fifteenth FET and a gate of said eighth FET, a gate coupled to said drain of said fourteenth FET, and a source coupled to said negative power supply level.

8. A method for producing an output clock signal having levels determined by positive and negative power supply levels in response to an input clock signal having levels determined by said positive power supply level and a ground level, comprising:

in a low state of said input clock signal, applying a positive potential to a control electrode of a first transistor of an output transistor pair to turn on said first transistor and a potential to a control electrode of a second transistor of said output transistor pair to turn off said second transistor, said first transistor having a source coupled to said negative power supply level and said second transistor having a drain coupled to said positive power supply level and a source coupled to a drain of said first transistor;

when said input clock signal makes a transition from said low state to a high state, charging a bootstrap capacitor through a third transistor between said positive and negative power supply levels to provide a boosted positive voltage to turn on said second transistor; and when a charge on said bootstrap capacitor has reached a predetermined level, connecting said control electrode of said first transistor to said negative power supply level to fully turn off said first transistor.

9. The method for producing an output clock signal of claim 8, wherein said step of connecting said control electrode of said first transistor to said negative supply level comprises turning on a fourth transistor in response to said charge on said bootstrap capacitor reaching said predetermined level to connect said control electrode of said first transistor to said negative power level through a channel of said fourth transistor.

10. The method for producing an output clock signal of claim 9, further comprising the step of, when said input clock signal makes a transition from said high state to said low state, discharging said bootstrap capacitor.

* * * * *

UNITED STATES PATENT AND TRADEMARK OFFICE
CERTIFICATE OF CORRECTION

PATENT NO. : 4,496,852
DATED : January 29, 1985
INVENTOR(S) : E. M. BLASER ET AL It is certified that error appears in the above-identified patent and that said Letters Patent is hereby corrected as shown below:

Title page:

IN THE ABSTRACT

Line 9, delete "base" insert --gate--;
    12, delete "base" insert --gate--;
    17, delete "base" insert --gate--;
    20, delete "base" insert --gate--;
    22, delete "base" insert --gate--.

Column 2, line 2, delete "13" insert --23--;
    line 3, delete "24" insert --21--;
    line 16, delete "11,"; delete "17";
    line 17, delete "the devices 15 and 16" insert --devices 24, 26 are turned on, nodes G and H will be at the $V_{SX}$ level, and thus devices 22 and 25 are also on since node F will be above $V_t$. Power will be dissipated through 22 and 24, 25 and 26.--;
    lines 18 through 20, delete in their entirety;
    line 21, change "when" to --When--;
    line 25, delete "keep" insert --allow-; after "26" insert --to--;
    line 26, change "turned" to --turn--; delete "on" and insert --off--.

UNITED STATES PATENT AND TRADEMARK OFFICE
CERTIFICATE OF CORRECTION

PATENT NO. : 4,496,852

DATED : January 29, 1985

INVENTOR(S) : E. M. BLASER ET AL

It is certified that error appears in the above-identified patent and that said Letters Patent is hereby corrected as shown below:

Column 4, line 40, change "$\varphi_1$" (first occurrence) to "$\bar{\varphi}_1$;

line 63, delete "51" and insert --37--;

line 65, delete "$V_{SX}$" insert --$V_{DD} - V_T$--;

Column 5, line 1, after "$V_{DD}$" insert -- $- V_T$--;

line 5, delete "VSX" insert --$V_{SX}$--.

Signed and Sealed this

Eighth Day of March, 1988

*Attest:*

DONALD J. QUIGG

*Attesting Officer*     *Commissioner of Patents and Trademarks*